United States Patent
Misra et al.

(10) Patent No.: US 6,616,965 B1
(45) Date of Patent: Sep. 9, 2003

(54) NON-HYDROLYTIC-SOL-GEL PROCESS FOR HIGH K DIELECTRIC

(75) Inventors: Sudhanshu Misra, Orlando, FL (US); Pradip Kumar Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/533,429

(22) Filed: Mar. 23, 2000

(51) Int. Cl.[7] .................................................. B05D 5/12
(52) U.S. Cl. .......................................... 427/79; 505/735
(58) Field of Search .............................. 427/79; 505/735

(56) References Cited

U.S. PATENT DOCUMENTS 5,024,991 A * 6/1991 Tsunashima et al. ........... 505/1
5,391,393 A * 2/1995 Maniar ........................... 438/3

* cited by examiner

Primary Examiner—Michael Barr
Assistant Examiner—Elena Tsoy

(57) ABSTRACT

Tantalum and niobium aluminum-doped hydrated mixed metal oxide sols may be made by a process comprising combining a first metal compound aluminum alkoxide, with a second metal compound selected from the group consisting of niobium alkoxide and tantalum alkoxide, and mixtures thereof to provide a substantially water-free precursor and combining the precursor with a ketone to provide a hydrated mixed metal oxide sol, wherein the ketone is substantially free of water. The sol may then be processed to obtain thin films, fibers, crystals (both micro- and mesoporous), powders and macroscopic objects and to provide mixed metal oxide that may be used in a variety of components of integrated circuits.

11 Claims, No Drawings

NON-HYDROLYTIC-SOL-GEL PROCESS FOR HIGH K DIELECTRIC

FIELD OF THE INVENTION

The field of this invention is high-dielectric constant materials, for use in integrated circuits.

BACKGROUND OF THE INVENTION

Integrated circuits in general, and CMOS devices in particular, have continued to gain wide spread usage as user demands for increased functionality and enhanced benefits continue to increase. In order to meet this demand, the integrated circuit industry continues to decrease the feature size of circuit structures in order to place more circuits in the same size integrated circuit area thereby continuously increasing the packing density for a given chip size. Over the last several years, structures have evolved from 1.2 micron gate lengths (1 Mbit capacity), down to gate feature sizes of 0.25 microns (1 Gbit capacity) and less.

For example, the ever-increasing demand for computer memory to facilitate calculations and data storage has fostered intense development efforts in the area of Dynamic Random Access Memory (DRAM), and especially embedded DRAM. The DRAM is generally a collection of transistor devices with each having an integrated circuit capacitor typically connected to its source electrode thereby forming a memory cell. This collection of memory cells is then arranged into a memory structure using a word line and a bit line to address each memory cell. This integrated capacitor may store an electrical charge to represent a binary "1" or store no electrical charge for a binary "0" as instructed by the word and bit control lines.

Construction of these memory capacitors consists of using typically a tungsten, copper or aluminum electrode structure, either parallel to the wafer surface, in a trench, or as a plug for 0.25 micron technology, connected to the source of the transistor, which then supports a dielectric material, such as tantalum pentoxide ($Ta_2O_5$), and then a top electrode, in sequence.

As the size technology of CMOS devices continues to shrink, the structure for a given memory size or circuit capability also shrinks as noted above. For example, the bond pads, which allow the integrated circuit to connect to external circuitry, cannot continue to shrink indefinitely. Currently, an integrated circuit package may have about 200 bond pads that are 50 microns by 50 microns in size. Shrinking topology coupled with this bond pad lower size limitation results in an excess of empty space around the bond pads. This allows for the inclusion of additional embedded memory around the bond pads. The use of higher dielectric constant oxides such as tantalum pentoxide as substitutes for silicon dioxide have allowed smaller structures still.

Tantalum pentoxide is an illustrative high-K (high dielectric constant) material used in integrated circuit elements such as gate and capacitor dielectrics. The dielectric is sandwiched between two electrodes to form a capacitor or between the gate and channel in a field effect device. However, there is a drawback to tantalum pentoxide used on aluminum electrodes. With time and temperature, the aluminum acts as a reducing agent to the tantalum pentoxide, forming aluminum oxide and reducing the tantalum pentoxide to tantalum suboxide, which is less of an insulator, and even to tantalum metal, which is a conductor. This conversion impairs the dielectric properties of the tantalum pentoxide and reduces the performance of any capacitors made with it due to leakage currents associated with tantalum metal shorts. The problem is particularly severe in capacitors formed on semiconductor wafers as part of an integrated circuit, because processing temperatures subsequent to dielectric deposition can approach the melting point of aluminum.

One approach to reducing the reactivity of tantalum pentoxide with aluminum is to pre-dope the tantalum pentoxide with about 1 to about 50 mole % aluminum oxide, preferably 1 to 20 % mole % aluminum oxide. The presence of the reaction product, aluminum oxide, in the tantalum oxide, reduces the thermodynamic tendency for the reaction to go forward. The greater the amount of aluminum oxide, the greater the inhibition of reduction, but the lower the dielectric constant. Tantalum pentoxide is normally deposited by chemical vapor deposition at elevated temperature when making integrated circuit capacitors, and is desirably amorphous as deposited. The presence of aluminum provides a benefit to capacitors with non-aluminum electrodes in that aluminum doping increases the crystal phase transformation temperature of tantalum pentoxide from 850 to 950 C., allowing for higher temperature post-processing without crystallization of the tantalum pentoxide. Tantalum pentoxide powder may also be sintered to form monolithic ceramic capacitor dielectric pieces, which then have electrodes metallized thereon.

Accordingly, it would be desirable if mixed tantalum aluminum oxide could be made in a low temperature spin-on form for use in aluminum electrode capacitors. Also, it would be desirable if the spin-on form could be made without free water, so that semiconductor wafer metallization is not corroded.

SUMMARY OF THE INVENTION

Tantalum and niobium aluminate hydrated mixed metal oxide sols may be made by a process comprising combining a first metal compound aluminum alkoxide, with a second metal compound selected from the group consisting of niobium alkoxide and tantalum alkoxide, and mixtures thereof to provide a substantially water-free precursor and combining the precursor with a ketone to provide a hydrated mixed metal oxide sol, wherein the ketone is substantially free of water.

The sol may then be processed to obtain thin films fibers, crystals (both micro- and meso-porous), powders and macroscopic objects.

DETAILED DESCRIPTION OF THE INVENTION

A precursor of tantalum/niobium and aluminum mixed metal oxide is illustratively made by the interaction of tantalum alkoxide and an aluminum alkoxide in a nonaqueous solvent like benzene under exposure to UV light. While not completely understood, and not wishing to be held to any theory, it is believed that a heterobimetallic precursor is formed, perhaps through transesterification. The heterobimetallic precursor is then converted to a hydrated mixed metal oxide sol by reacting the precursor with a ketone such as acetone. The metal alkoxides are converted to hydrated mixed metal oxides metal hydroxide and the corresponding alcohol is formed. The resulting sol is desirably stoichiometric and uniform with respect to the starting ratio of tantalum to aluminum. The hydrated mixed metal oxides in the sol may then be condensed to form mixed metal oxides while liberating water. While not completely understood, and not wishing to be held to any theory, the reaction sequence may unfold as shown below, exemplified for aluminum tris alkoxide. Aluminum alkoxide reacts with acetone to form an enolate complex, the reaction of 3 moles of acetone with the aluminum tris alkoxide yielding AlO(OH).$H_2O$ and 3 moles of mesitylene oxide. AlO(OH).$H_2O$ can then be converted to aluminum oxide by the addition of heat.

The ketone solvents that may be used include methyethylketone, methyl iso-butyketone and the like. Acetone is preferred.

Note that the desired amount of aluminum in the aluminum plus tantalum/niobium heterometallic precursor is preferably 50 mole % or less and most preferably about 1 to about 20 mole % aluminum, so that the $(Ta, Nb)_x Al_y O_z$ obtained has $y \leq x$.

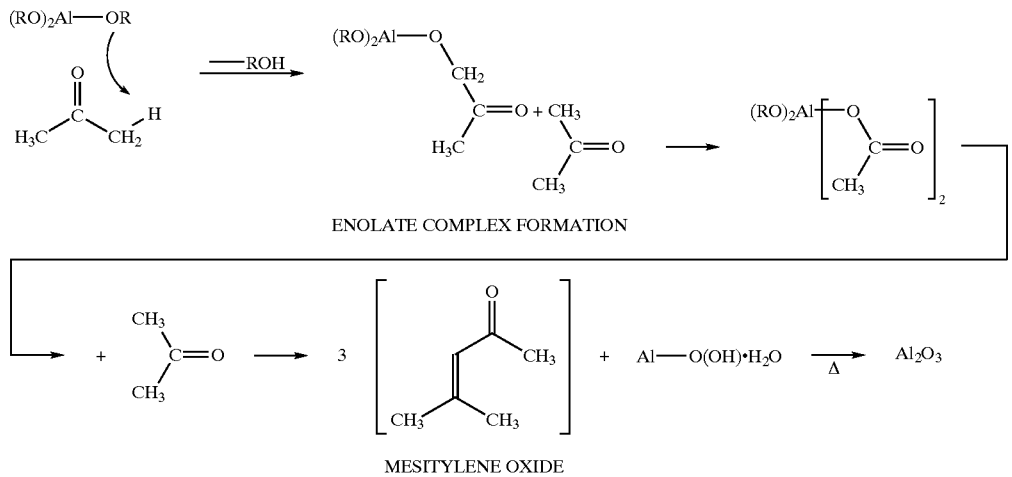

ENOLATE COMPLEX FORMATION

MESITYLENE OXIDE

Similarly, $(RO)_4$-Nb—OR yields NbO(OH)$_3$.$H_2O$ and NbAl $(OR)_x$ also follows an analogous mechanism with a non-hydrolytic process for sol-gel formation.

Exemplary aluminum alkoxides include aluminum n-butoxide, aluminum s-butoxide, aluminum t-butoxide, aluminum ethoxide, aluminum ethoxyethoxyethoxide, aluminum isopropoxide. Aluminum t-butoxide is preferred.

An exemplary tantalum or niobium reactant is selected from niobium alkoxide and tantalum alkoxide. Examples include niobium V n-butoxide, niobium V ethoxide, niobium V methoxide, niobium V trifluoroethoxide, tantalum V n-butoxide, tantalum V ethoxide, tantalum V methoxide, and tantalum V trifluoroethoxide. Preferred are niobium V t-butoxide and tantalum V t-butoxide. Note that, in comparison to tantalum oxide, niobium oxide also provides a high K material, but moreover, is expected to provide improved compatibility with lithium niobate substrates.

The solvent that the reactants are dissolved in is preferably hydrophobic, so that the reactants are not appreciably hydrolyzed by any aqueous contamination in the solvent prior to precursor formation. Note, however, that the reaction is robust enough not to require anhydrous grade solvents, and that the water that is always present in a solvent as an inevitable impurity is tolerated. A small amount of water in the solvent simply results in a slight amount of extra ketone in the final sol, which evaporates. A benefit of the present invention is that the actual addition of water to achieve hydrolysis is not required and the resulting sol will be substantially free of water, as any water impurities in the solvent will be gettered by the metal alkoxides. This means that the sol will be less likely to contribute to corrosion on any metallization that it contacts. In contrast, sols made by adding water to alkoxides may have excess water to assure complete hydrolysis. Aliphatic and aromatic solvents are preferred, benzene is particularly preferred. Note that any solvent of suitably low solubility parameter, including ethers, halocarbons and halohydrocarbons, are acceptable, provided that the solvents are not ketones or aldehydes.

Once the sol is obtained, the sol can be spun-on a substrate and converted to a mixed metal oxide by solvent evaporation and heating to convert the hydrated mixed metal oxide to mixed metal oxide. The sol will normally pass through a gel phase on the way to being dehydrated.

However, the sol can fist be turned into a gel which can be converted into monoliths, thin films, fibers, crystals, powders and micro-, meso- and nanoporous materials. Which product is obtained depends on starting shape, solvent removal and subsequent thermal processing. Conversion to a gel can be done by pH change, solvent exchange, addition of heat, aging and the like. If a thin film is poured, a substantially non-porous film can be formed due to the ease of solvent escape by diffusion. However, volatile components such as solvent and the alcohols obtained from the alkoxide groups can only escape from macroscopic gels through pores, and solvent exchange, temperature and vacuum can be used to modify pore size. Porous tantalum aluminum oxides and porous niobium aluminum oxides can be modified by infiltrating them with other metal oxide precursors prior to sintering to enable the production of tertiary and higher oxides that are not necessarily compatible if made with purely thermal techniques. Once obtained, the gels can be sintered for densificationt at temperatures significantly lower than those required for oxides made from oxide powders. Both the spin-on and monolithic formulas provided are particularly advantageous when used as a capacitor dielectric in contact with aluminum electrodes.

EXAMPLE

Aluminum tris (tert-butoxide) and niobium pentakis (tert-butoxide) in equimolar ratio are reacted in benzene in the presence of UV radiation to yield a unified organic precursor. The precursor undergoes efficient conversion into hydrated mixed metal oxides in the presence of acetone to form a sol.

The foregoing has disclosed preferred and alternative features and embodiments of the present invention so that one of ordinary skill in the art may better understand the detailed description of the invention that follows. Additional features of the invention will be described hereinafter that form the subject of the claims of the invention. One of ordinary skill in the art having the benefit of the present disclosure can appreciate that he can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A process for making a hydrated mixed metal oxide sol, comprising
    combining equimolar aluminum t-butoxide and niobium V t-butoxide in benzene that is substantially free of water and exposing to UV to provide a precursor;
    combining the precursor with acetone that is substantially free of water to provide a hydrated mixed metal oxide sol.

2. A process for making a hydrated mixed metal oxide sol, comprising:
    combining a first metal compound aluminum alkoxide, with a second metal compound selected from the group consisting of niobiun alkoxide and tantalum alkoxide, and mixtures thereof in the presence of UV light to provide a substantially water-free precursor; and
    combining the precursor with a ketone to provide a hydrated mixed metal oxide sol, wherein the ketone is substantially free of water.

3. The process of claim 2, further comprising the step of processing the sol to obtain a mixed metal oxide.

4. The process of claim 3, further comprising the step of densifying the mixed metal oxide.

5. The process of claim 3, further comprising contacting the mixed metal oxide with a metal.

6. The process of claim 3, further comprising contacting the mixed metal oxide with aluminum.

7. The process of claim 2, wherein the first metal compound is selected from the group consisting of aluminum n-butoxide, aluminum s-butoxide aluminum t-butoxide, aluminum ethoxide, aluminum ethoxyethoxyethoxide, aluminum isopropoxide, and mixtures thereof.

8. The process of claim 2, wherein the second metal compound is selected from the group consisting of niobium V n-butoxide, niobium V ethoxide, niobium V methoxide, niobium V trifluoroethoxide, niobium V t-butoxide, tantalum V n-butoxide, tantalum V ethoxide, tantalum V methoxide, tantalum V trifluoroethoxide and mixtures thereof.

9. The process of claim 2, wherein the first and second metal compounds are combined in the presence of a hydrophobic solvent.

10. The process of claim 2, wherein the first and second metal compounds are combined in the presence of benzene.

11. The process of claim 2, wherein the ketone is acetone.

* * * * *